US009053923B2

(12) United States Patent
Latypov et al.

(10) Patent No.: US 9,053,923 B2
(45) Date of Patent: Jun. 9, 2015

(54) METHODS FOR FABRICATING INTEGRATED CIRCUITS INCLUDING TOPOGRAPHICAL FEATURES FOR DIRECTED SELF-ASSEMBLY

(71) Applicant: GLOBALFOUNDRIES, Inc., Grand Cayman (KY)

(72) Inventors: Azat Latypov, San Jose, CA (US); Edward Teoh Kah Ching, San Jose, CA (US); He Yi, Stanford, CA (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 14/072,149

(22) Filed: Nov. 5, 2013

(65) Prior Publication Data

US 2015/0126034 A1    May 7, 2015

(51) Int. Cl.
*H01L 21/311* (2006.01)
*H01L 21/02* (2006.01)
*H01L 21/306* (2006.01)
*H01L 21/308* (2006.01)
*H01L 21/027* (2006.01)

(52) U.S. Cl.
CPC .... *H01L 21/02005* (2013.01); *H01L 21/30604* (2013.01); *H01L 21/308* (2013.01); *H01L 21/0271* (2013.01)

(58) Field of Classification Search
CPC ............... H01L 21/02005; H01L 21/30604; H01L 21/027; H01L 21/0271; H01L 21/0273; H01L 21/308; H01L 21/3083; H01L 21/3086
USPC .......... 438/700, 702, 717, 725, 945, 947, 948
See application file for complete search history.

(56) References Cited

U.S. PATENT DOCUMENTS

| | | | | |
|---|---|---|---|---|
| 7,347,953 | B2* | 3/2008 | Black et al. | 216/83 |
| 7,785,937 | B2* | 8/2010 | Kim et al. | 438/132 |
| 7,846,502 | B2* | 12/2010 | Kim et al. | 427/271 |
| 8,097,175 | B2* | 1/2012 | Millward et al. | 216/17 |
| 8,114,301 | B2* | 2/2012 | Millward et al. | 216/2 |
| 2010/0294740 | A1 | 11/2010 | Cheng et al. | |
| 2011/0147985 | A1 | 6/2011 | Cheng et al. | |

OTHER PUBLICATIONS

Wikipedia contributors, "Copolymer", Wikipedia, The Free Encyclopedia, http://en.wikipedia.org/w/index.php?title=Copolymer &oldid=457198836 (accessed Nov. 15, 2011).
Latypov et al., "Exploration of the directed self-assembly based nano-fabrication design space using computational simulations," Alternative Lithographic Technologies, Proc. of SPIE vol. 8680 868013-1, 2013.

* cited by examiner

*Primary Examiner* — Kevin M Picardat
(74) *Attorney, Agent, or Firm* — Ingrassia Fisher & Lorenz, P.C.

(57) ABSTRACT

Methods for fabricating integrated circuits are provided. In one example, a method for fabricating an integrated circuit includes forming etch resistant fill control topographical features that overlie a semiconductor substrate. The etch resistant fill control topographical features define an etch resistant fill control confinement well. A block copolymer is deposited into the etch resistant fill control confinement well. The block copolymer is phase separated into an etchable phase and an etch resistant phase. The etch resistant fill control topographical features direct the etch resistant phase to form an etch resistant plug in the etch resistant fill control confinement well.

20 Claims, 5 Drawing Sheets

METHODS FOR FABRICATING INTEGRATED CIRCUITS INCLUDING TOPOGRAPHICAL FEATURES FOR DIRECTED SELF-ASSEMBLY

TECHNICAL FIELD

The technical field relates generally to methods for fabricating integrated circuits, and more particularly relates to methods for fabricating integrated circuits including topographical features for directed self-assembly.

BACKGROUND

Decreasing device size and increasing device density has traditionally been a high priority for the manufacturing of integrated circuits. Optical lithography has been the driving force for device scaling. Conventional optical lithography is limited to about 80 nm pitch for single exposure patterning. Whilst double and other multi-patterning processes can realize smaller pitch, these approaches are expensive and more complex.

Directed self-assembly (DSA), a technique which aligns self-assembling polymeric materials on a lithographically defined guide pattern, is a potential option for extending current optical lithography beyond its pitch and resolution limits. The self-assembling materials, for example, are block copolymers (BCPs) that consist of "A" homopolymer covalently attached to "B" homopolymer, which are coated over a lithographically defined guide pattern on a semiconductor substrate. The lithographically defined guide pattern is a pre-pattern that is encoded with spatial chemical and/or topographical information and serves to direct the self-assembly process and the pattern formed by the self-assembling materials. Subsequently, by annealing the DSA polymers, the A polymer chains and the B polymer chains undergo phase separation to form an A polymer region and a B polymer region that are registered to the guide pattern. Then, by removing either the A polymer region or the B polymer region by wet chemical or plasma-etch techniques, a mask is formed for transferring the nanopattern to the underlying substrate.

One DSA technique is graphoepitaxy in which self-assembly is directed by topographical features that are formed overlying a semiconductor substrate. This technique is used, for example, to create contact holes or vias that can be subsequently filled with conductive material for forming electrical connections between one or more layers of the semiconductor substrate. In particular, the topographical features are formed overlying the semiconductor substrate to define confinement wells. The confinement wells are filled with a BCP that is subsequently phase separated to form, for example, etchable cylinders or other etchable features that are each formed of either the A polymer region or the B polymer region of the BCP. The etchable cylinders are removed to form openings and define a mask for etch transferring the openings to the underlying substrate. To ensure process uniformity, it is desirable to deposit a uniform thickness of the BCP without, for example, overfilling the confinement wells between the topographical features. The local density of the confinement wells generally varies across the semiconductor substrate with some areas having a higher density of confinement wells (e.g., relatively more confinement wells per unit area) and other areas having a lower density of confinement wells (e.g., relatively fewer confinement wells per unit area). In the lower density areas, the confinement wells are particularly susceptible to overfilling with the BCP. One solution is to add additional confinement wells to these areas to increase the local density of confinement wells. However, this may be undesirable because the artificially added confinement wells will generally result in additional features in the mask that will be etch transferred to the underlying substrate resulting, for example, in unintended electrical connections between layers of the substrate.

Accordingly, it is desirable to provide methods for fabricating integrated circuits including formation of topographical features for directed self-assembly with improved process uniformity for filling confinement wells formed by the topographical features with block copolymer. Furthermore, other desirable features and characteristics of the present invention will become apparent from the subsequent detailed description and the appended claims, taken in conjunction with the accompanying drawings and this background.

BRIEF SUMMARY

Methods for fabricating integrated circuits are provided herein. In accordance with an exemplary embodiment, a method for fabricating an integrated circuit includes forming etch resistant fill control topographical features that overlie a semiconductor substrate. The etch resistant fill control topographical features define an etch resistant fill control confinement well. A block copolymer is deposited into the etch resistant fill control confinement well. The block copolymer is phase separated into an etchable phase and an etch resistant phase. The etch resistant fill control topographical features direct the etch resistant phase to form an etch resistant plug in the etch resistant fill control confinement well.

In accordance with another exemplary embodiment, a method for fabricating an integrated circuit is provided. The method includes forming a plurality of topographical features overlying a semiconductor substrate. The plurality of topographical features include graphoepitaxy features that define a graphoepitaxy confinement well and etch resistant fill control topographical features that define an etch resistant fill control confinement well. The graphoepitaxy confinement well is filled with a first quantity of a block copolymer. The etch resistant fill control confinement well is filled with a second quantity of the block copolymer. The first quantity of the block copolymer is phase separated into a first etchable phase and a first etch resistant phase. The graphoepitaxy features direct the first etchable phase to extend longitudinally substantially through the graphoepitaxy confinement well. The second quantity of the block copolymer is phase separated into a second etchable phase and a second etch resistant phase. The etch resistant fill control topographical features direct the second etch resistant phase to obstruct the second etchable phase from extending longitudinally substantially through the etch resistant fill control confinement well.

In accordance with another exemplary embodiment, a method for fabricating an integrated circuit is provided. The method includes forming a plurality of topographical features overlying a semiconductor substrate to define a plurality of confinement wells. The plurality of confinement walls are arranged in a hexagonal pattern. The plurality of topographical features includes etch resistant fill control topographical features. The plurality of confinement wells includes etch resistant fill control confinement wells that are defined by the etch resistant fill control topographical features. A block copolymer is deposited into the plurality of confinement wells. The block copolymer is phase separated into an etchable phase and an etch resistant phase. The etch resistant fill control topographical features direct the etch resistant phase to form an etch resistant plug in each of the etch resistant fill control confinement wells.

BRIEF DESCRIPTION OF THE DRAWINGS

The various embodiments will hereinafter be described in conjunction with the following drawing figures, wherein like numerals denote like elements, and wherein.

DETAILED DESCRIPTION

Figure 1:
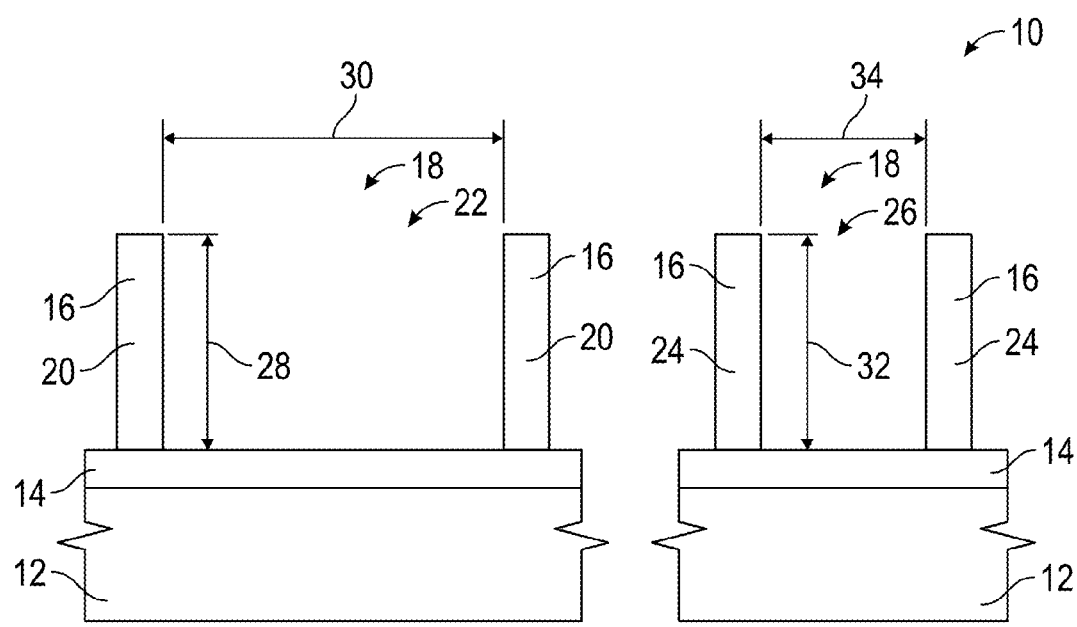
FIG. 1 illustrates, in cross-sectional view, an integrated circuit during an intermediate fabrication stage in accordance with an exemplary embodiment.

The following Detailed Description is merely exemplary in nature and is not intended to limit the various embodiments or the application and uses thereof. Furthermore, there is no intention to be bound by any theory presented in the preceding background or the following detailed description.

Various embodiments contemplated herein relate to methods for fabricating integrated circuits. The exemplary embodiments taught herein form a plurality of topographical features overlying a semiconductor substrate. The topographical features include graphoepitaxy features that define a graphoepitaxy confinement well and etch resistant fill control topographical features that define an etch resistant fill control confinement well. Graphoepitaxy features are herein understood to mean topographical features that are sized or otherwise configured to form confinement wells (i.e., graphoepitaxy confinement wells) for directing a block copolymer deposited therein to phase separate during annealing to form an etchable feature that can be etch transferred to the underlying substrate. Etch resistant fill control topographical features are herein understood to mean topographical features that are sized or otherwise configured to form confinement wells (i.e., etch resistant fill control confinement wells) for directing a block copolymer deposited therein to phase separate during annealing to prevent, obstruct, or otherwise resist formation of an etchable feature to prevent etch transferring a feature to the underlying substrate.

In an exemplary embodiment, the graphoepitaxy confinement well is filled with a first quantity of a block copolymer and a second quantity of the block copolymer fills the etch resistant fill control confinement well. In one embodiment, the etch resistant fill control confinement well is arranged proximate the graphoepitaxy confinement well to increase the local density of confinement wells to help ensure that the graphoepitaxy confinement well is not overfilled with block copolymer. The first quantity of the block copolymer is phase separated into a first etchable phase and a first etch resistant phase. In an exemplary embodiment, the graphoepitaxy features direct the first etchable phase to extend longitudinally substantially through the graphoepitaxy confinement well to define an etchable cylinder. The second quantity of the block copolymer is phase separated into a second etchable phase and a second etch resistant phase. In an exemplary embodiment, the etch resistant fill control topographical features direct the second etch resistant phase to obstruct the second etchable phase from extending longitudinally substantially through the etch resistant fill control confinement well by forming an etch resistant plug that extends laterally substantially across the etch resistant fill control confinement well.

In an exemplary embodiment, the phase separated block copolymer is etched to form an etch mask, in particular, by removing the etchable cylinder from the graphoepitaxy confinement well to form a first opening while the etch resistant plug obstructs etching of the second quantity of the block copolymer to prevent forming an additional opening through the etch resistant fill control confinement well. Using the etch mask, the first opening is etch transferred to the semiconductor substrate to form a second opening in the underlying substrate. Because an additional opening is not formed through the etch resistant fill control confinement well, an additional corresponding opening or other feature is not etch transferred from the etch mask to the underlying substrate, thereby helping to prevent forming an unintended electrical connection between layers of the semiconductor substrate.

FIGS. 1-6 illustrate methods for fabricating an integrated circuit 10 in accordance with various embodiments. The described process steps, procedures, and materials are to be considered only as exemplary embodiments designed to illustrate to one of ordinary skill in the art methods for practicing the invention; the invention is not limited to these exemplary embodiments. Various steps in the manufacture of integrated circuits are well known and so, in the interest of brevity, many conventional steps will only be mentioned briefly herein or will be omitted entirely without providing the well-known process details.

FIG. 1 illustrates, in cross-sectional view, the integrated circuit 10 during an intermediate fabrication stage in accordance with an exemplary embodiment. As illustrated, the integrated circuit 10 includes a semiconductor substrate 12. The semiconductor substrate 12 can be, for example, a bulk semiconductor substrate, silicon-on-insulator (SOI) semiconductor substrate, or any other semiconductor layer or layers overlying a bulk semiconductor substrate, or a SOI semiconductor substrate.

Overlying the semiconductor substrate 12 is a neutral brush layer 14. In an exemplary embodiment, the neutral brush layer 14 includes a random copolymer that has no preferential affinity for the individual polymeric block components of a block copolymer that will be subsequently deposited over the neutral brush layer 14 as part of a DSA process as will be discussed in further detail below. In one example, the neutral brush layer 14 is formed of a polystyrene-(random)-polymethylmethacrylate (PS-r-PMMA) copolymer brush that produces a neutral surface. In an exemplary embodiment, the neutral brush layer 14 has a thickness of from about 5 to about 10 nm. The neutral brush layer 14 may be formed, for example, by depositing a random copolymer onto the semiconductor substrate 12 using a spin coating process.

Although not illustrated, an anti-reflective coating, which is well known in the art and commonly referred to as ARC or BARC (bottom anti-reflective coating), may be optionally disposed between the semiconductor substrate 12 and the neutral brush layer 14. The ARC or BARC helps to absorb and/or control light to dampen or eliminate light reflection during photolithography to improve the photolithography process window for producing smaller features.

As illustrated, topographical features 16 are formed on the neutral brush layer 14 overlying the semiconductor substrate 12 and define confinement wells 18. In an exemplary embodiment, the topographical features 16 include graphoepitaxy features 20 that define a graphoepitaxy confinement well 22 and etch resistant fill control topographical features 24 that define an etch resistant fill control confinement well 26. As will be discussed in further detail below, the graphoepitaxy features 20 and the corresponding graphoepitaxy confinement well 22 are cooperatively configured to direct a block copolymer deposited in the graphoepitaxy confinement well 22 during phase separation to form an etchable feature that can be etch transferred to the semiconductor substrate 12. Additionally, the etch resistant fill control topographical features 24 and the corresponding etch resistant fill control confinement well 26 are cooperatively configured to direct a block copolymer deposited in the etch resistant fill control confinement well 26 during phase separation to prevent, obstruct, or otherwise resist formation of an etchable feature to prevent etch transferring a feature to the semiconductor substrate 12. In an exemplary embodiment, and as will be discussed in further detail below, the graphoepitaxy confinement well 22 has a depth (indicated by double headed arrow 28) and a width (indicated by double headed arrow 30) that helps direct a BCP deposited thereon to phase separate to form an etchable feature, e.g., etchable cylinder. In an exemplary embodiment, and as will be discussed in further detail below, the etch resistant fill control confinement well 26 has a depth (indicated by double headed arrow 32) and a width (indicated by double headed arrow 34) that helps direct a BCP deposited thereon to phase separate to form an etch resistant feature, e.g., etch resistant plug.

The topographical features 16 may be formed out of developed photoresist exposed and the optical or EUV lithography tool, or out of developed e-beam resist exposed by electronic beam and the e-beam lithography tool. Other techniques known to those skilled in the art may also be used to form the topographical features.

Figure 2:
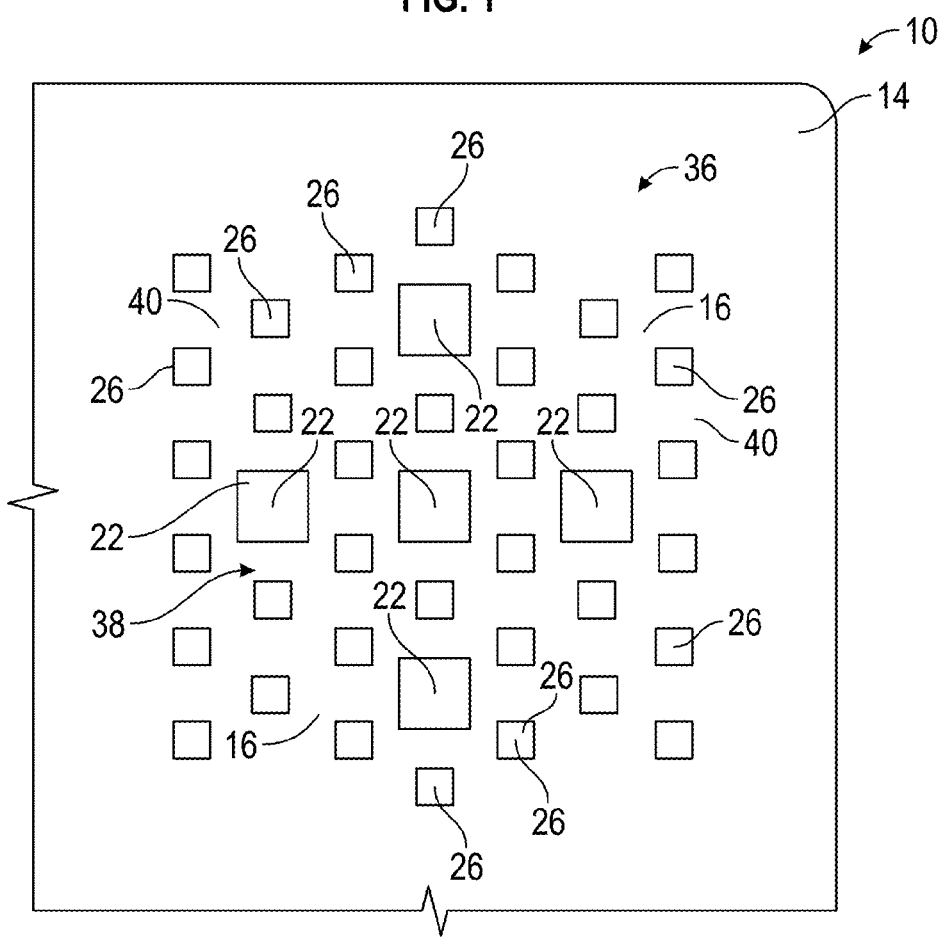
FIG. 2 illustrates, in top view, an integrated circuit during an intermediate fabrication stage in accordance with an exemplary embodiment.

FIG. 2 illustrates, in top view, the integrated circuit 10 in accordance with an exemplary embodiment. Although FIGS. 1 and 3-6 illustrate the topographical features 16 defining a single graphoepitaxy confinement well 22 and a single etch resistant fill control confinement well 26, it is to be appreciated that many graphoepitaxy and etch resistant fill control confinement wells may be used independently or together during fabrication of the integrated circuit 10. In an exemplary embodiment and as illustrated in FIG. 2, the topographical features 16 define a plurality of confinement wells 18 including a plurality of etch resistant control confinement wells 26 that are arranged locally or proximate to each other in a confinement well arrangement 36 that is configured as a hexagonal pattern, i.e., so that their geometrical centers form the grid of equilateral triangles. The confinement wells 18 also include the graphoepitaxy confinement wells 22. In an exemplary embodiment, the local density of graphoepitaxy confinement wells 22 is relatively low and the plurality of the etch resistant fill control confinement wells 26 is included in the hexagonal pattern to increase the local density of confinement wells 18. In an exemplary embodiment and as illustrated, the graphoepitaxy confinement wells 22 are disposed in an inner portion 38 of the confinement well arrangement 36 and the etch resistant fill control confinement wells 26 are disposed in both the inner portion 38 and a peripheral portion 40 of the confinement well arrangement 36 surrounding the inner portion 38. It has been found that by arranging the graphoepitaxy confinement wells 22 in the inner portion 38 of the hexagonal pattern 36 surrounded by the etch resistant fill control confinement wells 26, more uniform filling of the graphoepitaxy confinement wells 22 with block copolymer is achieved as will be discussed in further detail below.

Figure 3:
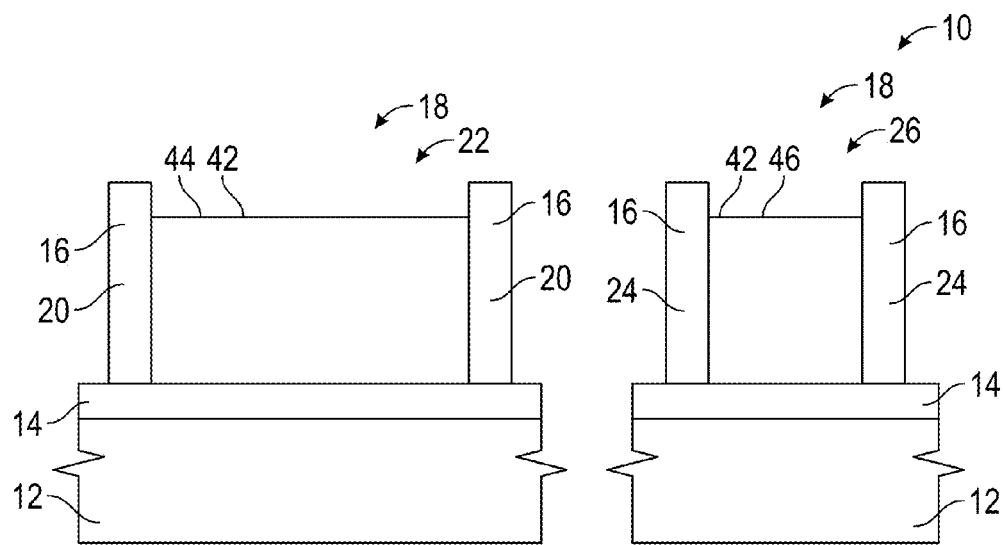
FIG. 3 illustrates, in cross-sectional view, an integrated circuit during a further advanced fabrication stage in accordance with an exemplary embodiment.

FIG. 3 illustrates, in cross-sectional view, the integrated circuit 10 during a further advanced fabrication stage in accordance with an exemplary embodiment. The process continues by depositing a block copolymer 42 into the confinement wells 18. In particular, the graphoepitaxy confinement well 22 and the etch resistant fill control confinement well 26 are correspondingly filled with quantities 44 and 46 of the block copolymer 42. In an exemplary embodiment, the block copolymer 42 has A polymer blocks and B polymer blocks. Non-limiting examples of block copolymers include polystyrene-block-polymethylmethacrylate (PS-b-PMMA), polystyrene-block-polybutadiene (PS-b-PB), polystyrene-block-poly(2-vinyl pyridine (PS-b-P2VP), polystyrene-block-polydimethylsiloxane (OS-b-PDMS), and polystyrene-block-polyethylene oxide (PS-b-PEO).

In an exemplary embodiment, the etch resistant fill control confinement well 26 is arranged proximate the graphoepitaxy confinement well 22 (see also FIG. 2) to increase the local density of confinement wells 18 to help ensure that the graphoepitaxy confinement well 22 is not overfilled with the block copolymer 42. In an exemplary embodiment, the block copolymer 42 is deposited into the confinement wells 18 using a spin coating process or the like.

Figure 4A:
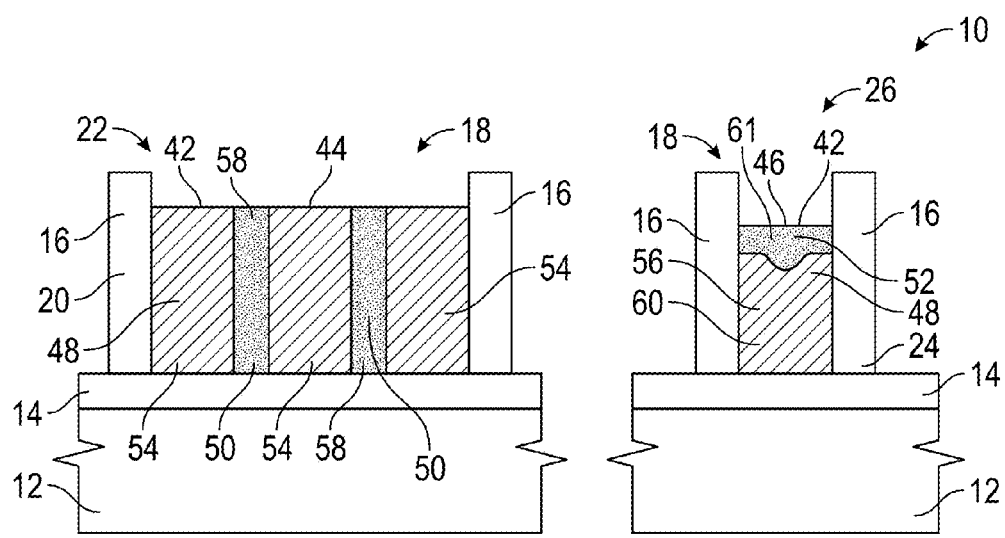
FIGS. 4A-4B illustrate, in cross-sectional views, an integrated circuit during a further advanced fabrication stage in accordance with an exemplary embodiment.
Figure 4B:
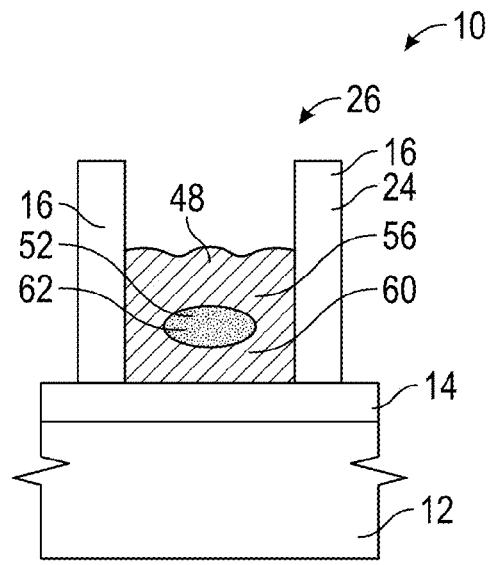

FIGS. 4A-4B illustrate, in cross-sectional views, the integrated circuit 10 during a further advanced fabrication stage in accordance with an exemplary embodiment. As illustrated in FIG. 4A, the block copolymer 42 is annealed, for example by either heating the block copolymer 42 at a predetermined temperature for a predetermined time or by applying an organic solvent such as methyl ethyl ketone (MEK), toluene, ethyl acetate, or the like to phase separate the block copolymer 42 and form a phase separated block copolymer 48. In an exemplary embodiment, the block copolymer 42 is heated at a predetermined temperature of from about 125 to about 350° C. for a predetermined time of from 1 minute to about 24 hours to form the phase separated block copolymer 48.

The phase separated block copolymer 48 shown in FIGS. 4A-4B has etchable phases 50 and 52 and etch resistant phases 54 and 56. Depending upon the particular block copolymer 42, the etchable phases 50 and 52 are formed from either the A polymer blocks or the B polymer blocks of the block copolymer 42 and the etch resistant phases 54 and 56 are formed from the other of the A polymer blocks or the B polymer blocks. In an exemplary embodiment, the block copolymer 42 is PS-b-PMMA and the etchable phases 50 and 52 are PMMA and the etch resistant phases 54 and 56 are PS. In an exemplary embodiment, the etchable phases 50 and 52 are the volume fraction minority phase of the block copolymer 42 (e.g., either the A polymer blocks or the B polymer blocks) and the etch resistant phases 54 and 56 are the volume fraction majority phase of the block copolymer 42 (e.g., the other of the A polymer blocks or the B polymer blocks).

In an exemplary embodiment and as illustrated on the left side of FIG. 4A, the phase separated block copolymer 48 in the graphoepitaxy confinement well 22 is spatially registered to the graphoepitaxy features 20 to define a nanopattern that allows for resolution, for example, in the nanometer range beyond that of conventional optical lithography techniques.

In particular and as illustrated, the quantity 44 of the block copolymer 42 in the graphoepitaxy confinement well 22 is phase separated and the graphoepitaxy features 20 direct the etchable phase 50 to extend longitudinally substantially through the graphoepitaxy confinement well 22. In one example, the graphoepitaxy features 20 direct the etchable phase 50 to form etchable cylinders 58 extending longitudinally substantially through the graphoepitaxy confinement well 22.

In an exemplary embodiment and as illustrated on the right side of FIG. 4A, the quantity 46 of the block copolymer 42 in the etch resistant fill control confinement well 26 is phase separated and the etch resistant fill control topographical features 24 direct the etch resistant phase 56 to obstruct the etchable phase 52 from extending longitudinally substantially through the etch resistant fill control confinement well 26. In an exemplary embodiment, the etch resistant fill control topographical features 24 direct the etch resistant phase 56 to form an etch resistant plug 60 underlying a portion 61 of the etchable phase 52 in the etch resistant fill control confinement well 26. In an exemplary embodiment and as illustrated of the right side of FIG. 4A, the etch resistant plug 60 may be formed as a solid plug of the etch resistant phase 56 when the block copolymer 42 is phase separated in the etch resistant fill control confinement well 26 having the depth 32 (see FIG. 1) and/or the width 34 (see FIG. 1), depending upon the particular composition of the block copolymer 42, sized so as to direct such formation. FIG. 4A (right side) thus illustrates the formation of the etch resistant DSA result (that is, BCP phase separation occurring without forming an etchable cylinder) in the confinement well 26 of sufficiently small width, depending on the particular composition of the BCP. The width of the confinement well 26 resulting in such etch resistant DSA result can be determined by conducting parametric studies of the DSA in confinement wells covering a certain range of widths, either by means of computational simulations or experimentally.

In an alternative exemplary embodiment and as illustrated in FIG. 4B, the etch resistant plug 60 may be formed as the plug 60 of the etch resistant phase 56 surrounding a portion 62 of the etchable phase 52 when the block copolymer 42 is phase separated in the etch resistant fill control confinement well 26 having the depth 32 (see FIG. 1) and/or the width 34 (see FIG. 1), depending upon the particular composition of the block copolymer 42, sized so as to direct such formation. FIG. 4B thus illustrates the formation of the etch resistant DSA result (that is, BCP phase separation resulting in an internal cavity 62 of the minority etchable BCP phase and without forming an etchable cylinder) in the confinement well 26 of sufficiently large width, dependent on the particular composition of the BCP. It should be noted that the internal minority phase cavity 62 may have a variety of shapes, including, for example, a toroidal (doughnut-like) shape. The range of confinement well widths yielding etch resistant DSA result as shown on the right side of FIG. 4B can be determined by conducting parametric studies of the DSA in confinement wells covering a certain range of widths, either by means of computational simulations or experimentally.

Figure 5:
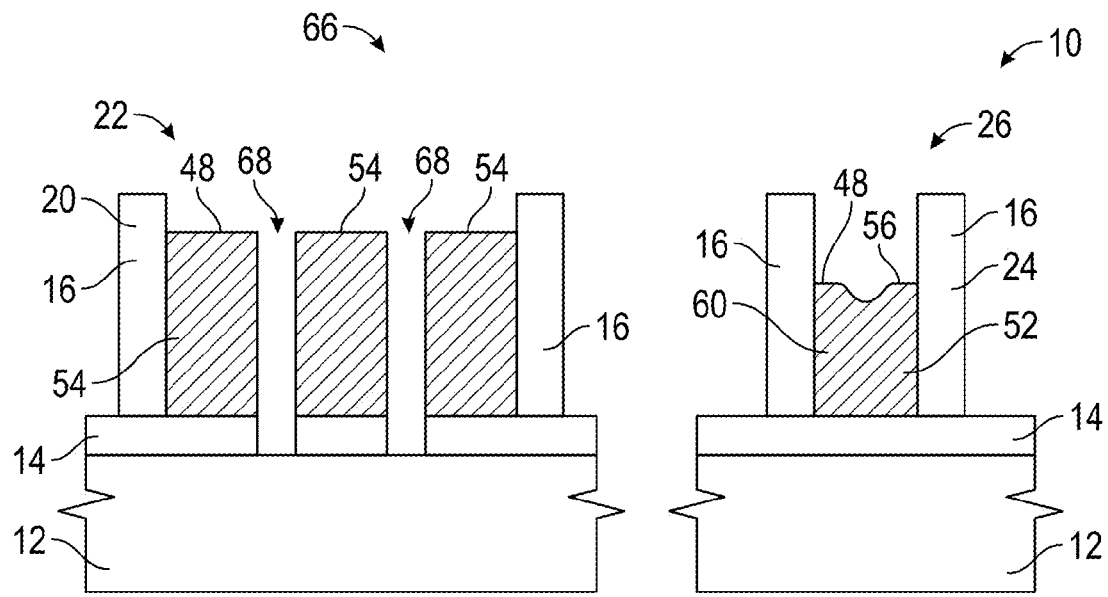
FIG. 5 illustrates, in cross-sectional view, an integrated circuit during a further advanced fabrication stage in accordance with an exemplary embodiment.
Figure 6:
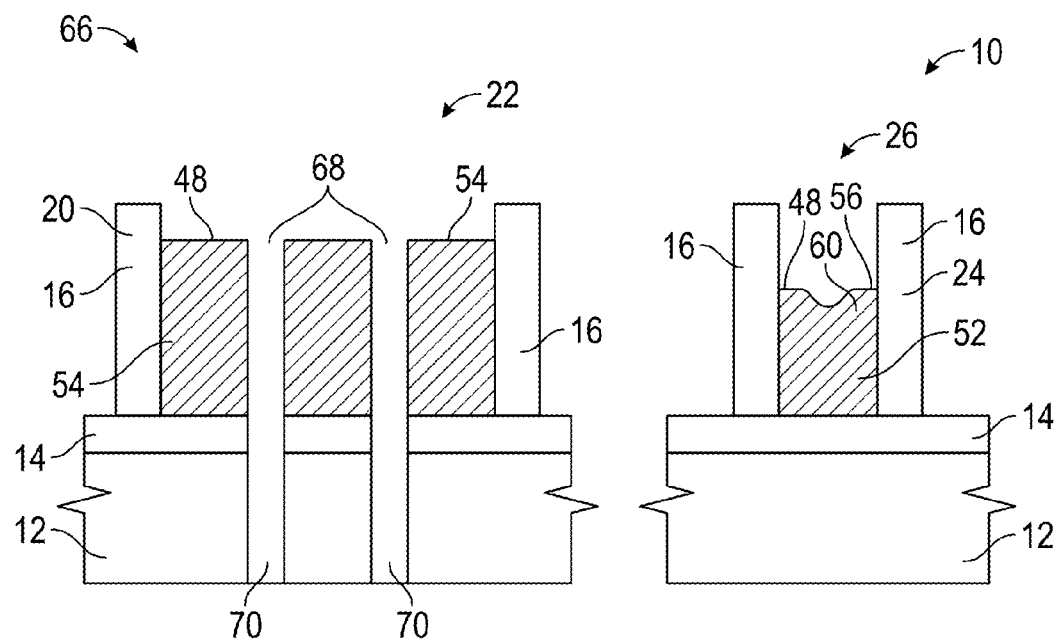
FIG. 6 illustrates, in cross-sectional view, an integrated circuit during a further advanced fabrication stage in accordance with an exemplary embodiment.

The process continues as illustrated in FIG. 5 by etching the phase separated block copolymer 48 to form an etch mask 66. In particular, the phase separated block copolymer 48 is etched to remove the etchable phase 50 (e.g., etchable cylinders 58) from the graphoepitaxy confinement well 22 while substantially leaving the etch resistant phase 54 to define openings 68. In the etch resistant fill control confinement well 26, the portion 61 of the etchable phase 52 is removed to expose the etch resistant plug 60, which substantially obstructs further etching of the etchable phase 52 that underlies the etch resistant plug 60. As such, the etch resistant plug 60 prevents formation of a continuous opening through the phase separated block copolymer 48 disposed in the etch resistant fill control confinement well 26. In an exemplary embodiment, the etch mask 66 is formed by exposing the phase separated block copolymer 48 to a dry etching process, such as reactive-ion etching (RIE) plasma, that selectively etches the etchable phases 50 and 52 while substantially leaving the etch resistant phases 54 and 56 intact. As illustrated in FIG. 6, using the etch mask 66, the openings 68 are etch transferred to the semiconductor substrate 12 to form openings 70 without etch transferring any features from the etch resistant fill control confinement well 26 to the substrate 12. In an exemplary embodiment, the openings 70 are formed using a conventional wet or dry etching process.

Example

Figure 7:
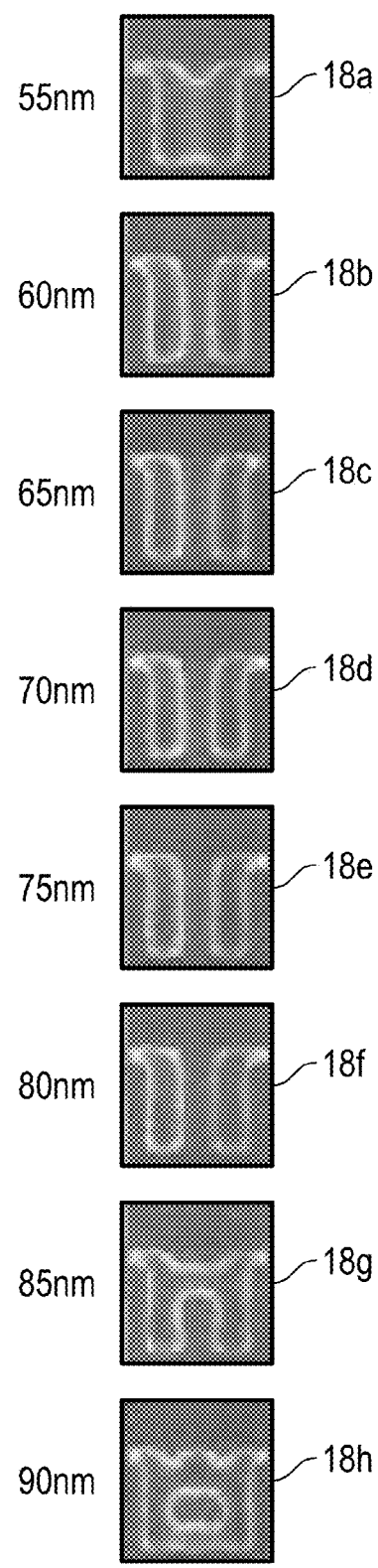
FIG. 7 is an example of computational simulations for determining the dimensions of topographical features and corresponding confinement wells in accordance with an exemplary embodiment.

FIG. 7 is an example of computational simulations for determining the dimensions of topographical features and corresponding confinement wells in accordance with an exemplary embodiment. The example is provided for illustration purposes only and is not meant to limit the various embodiments in any way.

To simulate graphoepitaxy DSA patterns, a masking method referenced in *Exploration of the Directed Self-Assembly Based Nano-Fabrication Design Space Using Computational Simulations* by Azat Latypov et al. is used to model confinement of block copolymers in a three-dimensional simulation domain and is incorporated herein by reference in its entirety. The BCP used for the simulation was PS-b-PMMA with a volume fraction of a PS phase of f=0.7, a degree of polymerization of N=663, and an unperturbed radius of gyration of $R_g$=10 nm. The depth of the confinement wells 18a-h was set to 50 nm and the widths of the confinement wells 18a-h were varied from 55 to 90 nm. As illustrated, the confinement wells 18b-f having widths of from 60 nm to 80 nm formed an etchable DSA cylinder of PMMA and the confinement wells 18a and 18g-h formed etch resistant plugs of PS. As such, in this example, confinement wells having widths of 55 nm or less, or alternatively, widths of 85 to 90 nm were sized to facilitate forming an etch resistant plug, whereas confinement wells having widths of from 60 to 80 nm were sized to facilitate forming an etchable cylinder. It should be noted that similar results can be obtained experimentally by those skilled in the art by forming families of confinement wells with likewise varying widths and/or depths and performing the DSA process with one or more compositions of block copolymer.

Accordingly, methods for fabricating integrated circuits have been described. The exemplary embodiments taught herein form etch resistant fill control topographical features that overlie a semiconductor substrate. The etch resistant fill control topographical features define an etch resistant fill control confinement well. A block copolymer is deposited into the etch resistant fill control confinement well. The block copolymer is phase separated into an etchable phase and an etch resistant phase. The etch resistant fill control topographical features direct the etch resistant phase to form an etch resistant plug in the etch resistant fill control confinement well.

While at least one exemplary embodiment has been presented in the foregoing detailed description of the disclosure, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing an exemplary embodiment of the disclosure. It being understood that various changes may be made in the function and arrangement of elements described in an exemplary embodiment without departing from the scope of the disclosure as set forth in the appended claims.

What is claimed is:

1. A method for fabricating an integrated circuit comprising:
forming etch resistant fill control topographical features that overlie a semiconductor substrate and that define an etch resistant fill control confinement well;
depositing a block copolymer into the etch resistant fill control confinement well; and
phase separating the block copolymer into an etchable phase and an etch resistant phase defining a phase separated block copolymer, wherein the etch resistant fill control topographical features direct the etch resistant phase to form an etch resistant plug in the etch resistant fill control confinement well, wherein the etch resistant plug is configured to prevent any opening from being formed continuously through the phase separated block copolymer that is in the etch resistant fill control confinement well when the phase separated block copolymer is etched to remove at least a portion of the etchable phase.

2. The method of claim 1, wherein phase separating comprises forming the etch resistant plug extending laterally substantially across the etch resistant fill control confinement well.

3. The method of claim 1, wherein phase separating comprises forming the etch resistant plug surrounding a portion of the etchable phase.

4. The method of claim 1, wherein forming the etch resistant fill control topographical features comprise forming the etch resistant fill control confinement well having a predetermined depth that facilitates directing formation of the etch resistant plug.

5. The method of claim 4, wherein forming the etch resistant fill control topographical features comprise forming the etch resistant fill control confinement well having the predetermined depth defined by computational simulations.

6. The method of claim 4, wherein forming the etch resistant fill control topographical features comprise forming the etch resistant fill control confinement well having the predetermined depth defined experimentally.

7. The method of claim 1, wherein forming the etch resistant fill control topographical features comprise forming the etch resistant fill control confinement well having a predetermined width that facilitates directing formation of the etch resistant plug.

8. The method of claim 7, wherein forming the etch resistant fill control topographical features comprise forming the etch resistant fill control confinement well having the predetermined width defined by computational simulations.

9. The method of claim 7, wherein forming the etch resistant fill control topographical features comprise forming the etch resistant fill control confinement well having the predetermined width defined experimentally.

10. The method of claim 1, wherein depositing the block copolymer comprises depositing the block copolymer having a volume fraction minority phase and a volume fraction majority phase.

11. The method of claim 10, wherein phase separating the block copolymer comprises phase separating the block copolymer into the volume fraction majority phase as the etch resistant phase.

12. The method of claim 10, wherein phase separating the block copolymer comprises phase separating the block copolymer into the volume fraction minority phase as the etchable phase.

13. A method for fabricating an integrated circuit comprising:
forming a plurality of topographical features overlying a semiconductor substrate including graphoepitaxy features that define a graphoepitaxy confinement well and etch resistant fill control topographical features that define an etch resistant fill control confinement well;
filling the graphoepitaxy confinement well with a first quantity of a block copolymer;
filling the etch resistant fill control confinement well with a second quantity of the block copolymer;
phase separating the first quantity of the block copolymer into a first etchable phase and a first etch resistant phase, wherein the graphoepitaxy features direct the first etchable phase to extend longitudinally substantially through the graphoepitaxy confinement well; and
phase separating the second quantity of the block copolymer into a second etchable phase and a second etch resistant phase defining a phase separated block copolymer, wherein the etch resistant fill control topographical features direct the second etch resistant phase to obstruct the second etchable phase from extending longitudinally substantially through the etch resistant fill control confinement well for preventing any opening from being formed continuously through the phase separated block copolymer that is in the etch resistant fill control confinement well when the phase separated block copolymer is etched to remove at least a portion of the second etchable phase.

14. The method of claim 13, wherein phase separating the first quantity of the block copolymer comprises directing the first etchable phase to form an etchable cylinder that extends longitudinally substantially through the graphoepitaxy confinement well.

15. The method of claim 13, further comprising:
depositing a neutral brush layer overlying the semiconductor substrate, wherein forming the plurality of topographical features comprises forming the plurality of topographical features overlying the neutral brush layer.

16. The method of claim 13, wherein phase separating the second quantity of the block copolymer comprises directing the second etch resistant phase with the etch resistant fill control topographical features to form an etch resistant plug, and wherein the method further comprises:
etching the block copolymer after phase separating the first and second quantities to remove the first etchable phase from the graphoepitaxy confinement well to form a first opening while obstructing etching of the second quantity of the block copolymer with the etch resistant plug to prevent forming an opening through the etch resistant fill control confinement well, thereby defining an etch mask.

17. The method of claim 16, further comprising:
etching a second opening into the semiconductor substrate using the etch mask, wherein the second opening is aligned with the first opening.

18. A method for fabricating an integrated circuit comprising:

forming a plurality of topographical features overlying a semiconductor substrate to define a plurality of confinement wells arranged in a hexagonal pattern, wherein the plurality of topographical features includes etch resistant fill control topographical features and the plurality of confinement wells includes etch resistant fill control confinement wells that are defined by the etch resistant fill control topographical features;

depositing a block copolymer into the plurality of confinement wells; and phase separating the block copolymer into an etchable phase and an etch resistant phase defining a phase separated block copolymer, wherein the etch resistant fill control topographical features direct the etch resistant phase to form an etch resistant plug in each of the etch resistant fill control confinement wells, wherein the etch resistant plugs are configured to prevent any opening from being formed continuously through the phase separated block copolymer that is in the etch resistant fill control confinement wells when the phase separated block copolymer is etched to remove at least a portion of the etchable phase.

19. The method of claim 18, wherein forming the plurality of topographical features comprises forming graphoepitaxy features that define a graphoepitaxy confinement well that is disposed in an inner portion of the hexagonal pattern.

20. The method of claim 19, wherein forming the plurality of topographical features comprises forming the etch resistant fill control topographical features that define the etch resistant fill control confinement wells that are disposed in a perimeter portion of the hexagonal pattern surrounding the inner portion.

\* \* \* \* \*